(12) United States Patent
Hatta et al.

(10) Patent No.: US 8,822,326 B2
(45) Date of Patent: Sep. 2, 2014

(54) METHOD FOR MANUFACTURING SN ALLOY BUMP

(75) Inventors: Takeshi Hatta, Sanda (JP); Akihiro Masuda, Sanda (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 13/981,862

(22) PCT Filed: Jan. 16, 2012

(86) PCT No.: PCT/JP2012/000217
§ 371 (c)(1),
(2), (4) Date: Jul. 25, 2013

(87) PCT Pub. No.: WO2012/101975
PCT Pub. Date: Aug. 2, 2012

(65) Prior Publication Data
US 2013/0309862 A1 Nov. 21, 2013

(30) Foreign Application Priority Data
Jan. 26, 2011 (JP) ................. 2011-013661

(51) Int. Cl.
*H01L 21/44* (2006.01)
(52) U.S. Cl.
USPC .................... 438/612; 438/615; 257/E21.508

(58) Field of Classification Search
USPC ............ 438/612–615; 257/E21.508, E21.509
See application file for complete search history.

(56) References Cited

U.S. PATENT DOCUMENTS

2009/0218230 A1* 9/2009 Iijima .......................... 205/85

FOREIGN PATENT DOCUMENTS

| JP | 2002-203868 A | 7/2002 |
| JP | 2009-206334 A | 9/2009 |

OTHER PUBLICATIONS

International Search Report of PCT/JP2012/000217, dated Apr. 17, 2012.

* cited by examiner

*Primary Examiner* — Thanhha Pham
(74) *Attorney, Agent, or Firm* — Edwards Wildman Palmer LLP; Jeffrey D. Hsi

(57) ABSTRACT

Provided is a method for manufacturing an Sn alloy bump, wherein composition of the Sn alloy bump can be readily controlled. The method for manufacturing an Sn alloy bump formed of an alloy composed of Sn and other one or more types of metals has a step of forming an Sn layer on an electrode pad in a resist opening formed on a substrate by electrolytic plating; a step of laminating Sn and an alloy layer on the Sn layer by electrolytic plating; and a step of forming an Sn alloy bump by melting the Sn layer and the laminated alloy layer after removal of a resist.

4 Claims, 3 Drawing Sheets

METHOD FOR MANUFACTURING SN ALLOY BUMP

CROSS-REFERENCE TO RELATED APPLICATIONS

This application is the U.S. National Stage of PCT International Application No. PCT/JP2012/000217, filed Jan. 16, 2012, which claims the benefit of Japanese Patent Application No. 2011-013661 filed Jan. 26, 2011, the entire contents of the aforementioned applications are hereby incorporated herein by reference.

BACKGROUND OF THE INVENTION

1. Field of the Invention

The present invention relates to a method for manufacturing an Sn alloy bump that is preferably used for flip-chip mounting for mounting an electronic component on a substrate.

2. Description of the Related Art

At present, methods for mounting the surface of a print substrate by flip-chip mounting using a bump are often employed when electronic components are mounted on the print substrate or the like. As a method for forming the bump, for example, a solder layer is formed on an electrode pad in a resist opening formed on a substrate by electrolytic plating and then the solder layer is melt by performing reflow soldering after removal of resist to thereby form a generally spherical bump.

In recent years, a solder used for bonding electronic components to a substrate has been developed as a lead-free solder material because a lead (Pb)-containing solder material is not preferred in view of environmental aspects. Also, for the material of a bump, it has been thought to use an Sn—Ag binary solder, an Sn—Cu binary solder, an Sn—Ag—Cu ternary solder, and the like having Sn as their main component.

For example, Patent Document 1 discloses a method for forming an Sn—Ag—Cu ternary thin film on a substrate, where the substrate is immersed into a plating bath containing an Sn compound, an Ag compound, and a Cu compound to thereby form the Sn—Ag—Cu ternary thin film by electroplating.

Also, Patent Document 2 discloses a method for forming an Sn—Ag—Cu solder alloy, where Sn—Ag alloy plating is performed and then the resulting multi-layer alloy plating layer is subject to reflow soldering after Sn—Cu alloy plating is performed.

PRIOR ART DOCUMENTS

Patent Documents

Patent Document 1: Japanese Patent Laid-Open No. 2006-291323
Patent Document 2: Japanese Patent Laid-Open No. 2003-342784

SUMMARY OF THE INVENTION

Problems to be Solved by the Invention

However, the following problems still remain in the conventional techniques described above.

Specifically, when plating is performed by using an Sn—Ag—Cu alloy plating solution or when two layer plating is performed by using an Sn—Ag plating solution and an Sn—Cu plating solution to thereby form alloy plating in the opening (via) of resist on high aspect ratio pattern for fine pitching in recent microminiaturization, precipitation of Ag and Cu is suppressed at the bottom of the opening and thus the amount of Ag and Cu to be precipitated is reduced at the bottom, resulting in undesirable increase in Sn precipitation at the bottom. Consequently, compositional variations occur in the height direction of the opening, resulting in a difficulty in compositional control in the Sn alloy bump. In particular, when electrolytic plating is repeated a number of times, an acid concentration in the plating solution becomes high, resulting in an increase in viscosity of the solution. Consequently, it becomes further difficult for Ag to be precipitated at the bottom, resulting in a difficulty in obtaining a stable composition after reflow.

The present invention has been made in view of the aforementioned circumstances and an object of the present invention is to provide a method for manufacturing an Sn alloy bump, which can readily perform compositional control in the height direction of the Sn alloy bump.

Means for Solving the Problems

The present invention adopts the following structure in order to solve the aforementioned problems. Specifically, the method for manufacturing an Sn alloy bump of the present invention is a method for manufacturing an Sn alloy bump formed of an alloy composed of Sn and other one or more types of metals and is characterized in that the method includes a step of forming an Sn layer on an electrode in a resist opening formed on a substrate by electrolytic plating; a step of laminating an alloy layer composed of Sn and the other metal on the Sn layer by electrolytic plating; and a step of forming an Sn alloy bump by melting the Sn layer and the alloy layer after removal of the resist.

In the method for manufacturing an Sn alloy bump, since an Sn layer is formed on an electrode by electrolytic plating and an alloy layer composed of Sn and the other metal (the other one or more types of metals) is laminated on the Sn layer by electrolytic plating, the depth of the opening is reduced by the preformed Sn layer when the preformed Sn layer is further plated with an alloy layer so that compositional variations of the other metal can be suppressed in the height direction. Note that the composition of the other metal contained in the alloy layer for lamination is set higher than the case of only an alloy plating of Sn and the other metal depending on the target composition of an Sn alloy bump obtained by melting the Sn layer and the alloy layer, so that compositional control in the Sn alloy bump can be performed.

Also, the method for manufacturing an Sn alloy bump of the present invention is characterized in that the other metal is Ag and the method includes a step of forming an Sn—Ag layer as the alloy layer on the Sn layer by electrolytic plating; and a step of forming an Sn—Ag bump as the Sn alloy bump by melting the Sn layer and the Sn—Ag layer after removal of the resist.

Specifically, in the method for manufacturing an Sn alloy bump, since an Sn—Ag layer is formed on an Sn layer by electrolytic plating and then the Sn layer and the Sn—Ag layer are melted, an Sn—Ag alloy bump in which compositional variations of Ag due to the precipitation of Ag are reduced in the height direction can be formed.

Also, the method for manufacturing an Sn alloy bump of the present invention is characterized in that the other metal is composed of two types of metals and the method includes a step of laminating two layers of an alloy layer composed of Sn and one of the two types of metals and an alloy layer composed of Sn and the other of the two types of metals on the Sn layer by electrolytic plating; and a step of forming an Sn alloy bump by melting the Sn layer and the two alloy layers laminated thereon after removal of the resist.

Specifically, in the method for manufacturing an Sn alloy bump, since two layers of an alloy layer composed of Sn and one of the two types of metals and an alloy layer composed of Sn and the other of the two types of metals are laminated on the Sn layer by electrolytic plating, the depth of the opening is reduced by the preformed Sn layer when the preformed Sn layer is further plated with two alloy layers so that compositional variations of two types of metals can be suppressed in the height direction.

Furthermore, the method for manufacturing an Sn alloy bump of the present invention is characterized in that one of the two types of metals is Ag and the other of the two types of metals is Cu and the method includes a step of forming two layers composed of an Sn—Ag layer and an Sn—Cu layer on the Sn layer by electrolytic plating; and a step of forming an Sn—Ag—Cu bump as the Sn alloy bump by melting the Sn layer, the Sn—Ag layer, and the Sn—Cu layer after removal of the resist.

Specifically, in the method for manufacturing an Sn alloy bump, since two layers composed of an Sn—Ag layer and an Sn—Cu layer are formed on the Sn layer by electrolytic plating and then the Sn layer, the Sn—Ag layer, and the Sn—Cu layer are melted, an Sn—Ag—Cu alloy bump in which compositional variations of Ag and Cu due to the precipitation of Ag and Cu are reduced in the height direction can be formed.

Effects of the Invention

According to the present invention, the following effects may be provided.

Specifically, according to the method for manufacturing an Sn alloy bump of the present invention, since an Sn layer is formed on an electrode by electrolytic plating and an alloy layer composed of Sn and the other metal is laminated on the Sn layer by electrolytic plating, compositional variations of the other metal can be suppressed in the height direction and the composition of a bump to be formed by melting the layers can be controlled.

Thus, according to the method for manufacturing an Sn alloy bump of the present invention, an Sn alloy bump having high compositional uniformity corresponding to a high aspect ratio pattern can be obtained so that the method may be able to respond to fine pitching.

BEST MODES FOR CARRYING OUT THE INVENTION

Figure 1:
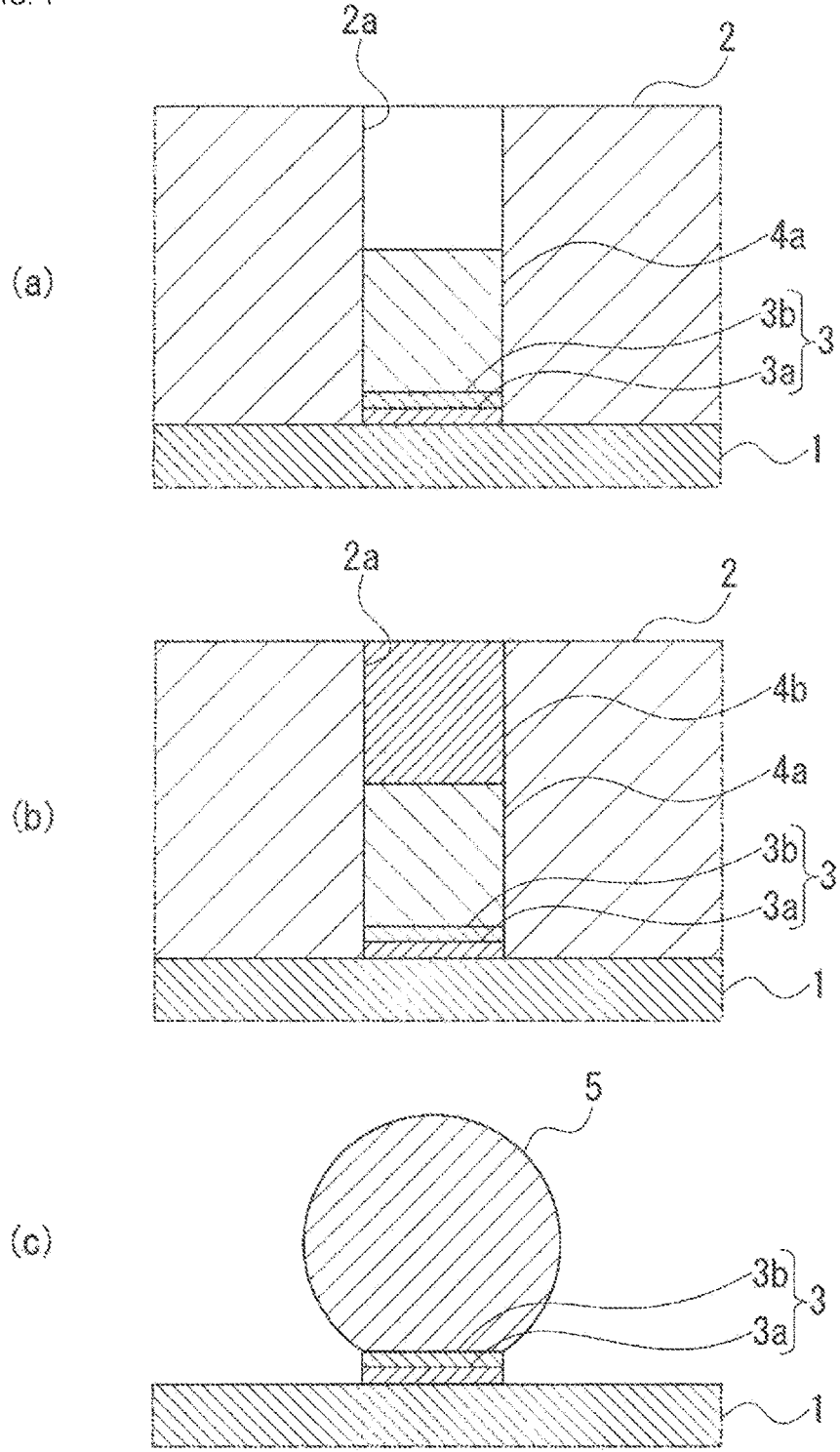
FIG. 1 is a schematic cross-sectional view illustrating the essential part of manufacturing steps in sequence in a method for manufacturing an Sn alloy bump according to a first embodiment of the present invention.

Hereinafter, a description will be given of a method for manufacturing an Sn alloy Pump according to a first embodiment of the present invention with reference to FIG. 1.

A method for manufacturing an Sn alloy bump according to the first embodiment is a method for manufacturing an Sn alloy bump formed of an alloy composed of Sn and other one or more types of metals such as Ag. As shown in FIG. 1, the method includes a step of forming an Sn layer (4a) on an electrode pad (3) in an opening (2a) of a resist (2) formed on a substrate (1) by electrolytic plating; a step of laminating an alloy layer (4b) composed of Sn and the other metal on the Sn layer (4a) by electrolytic plating; and a step of forming an Sn alloy bump (5) by melting the Sn layer (4a) and the alloy layer (4b) laminated thereon by reflow processing after removal of the resist (2).

For example, a description will be given of a case where the other metal is Ag. As shown in FIG. 1(a), the Sn layer (4a) is firstly formed on the electrode pad (3) in the opening (2a) of the resist (2) formed on the substrate (1) by electrolytic plating. For example, the Sn layer (4a) is formed with half the depth of the opening (2a).

Examples of the substrate (1) include a semiconductor wafer, a print substrate, a heat sink substrate, or the like. The resist (2) is patterned on the surface of the substrate (1) and the opening (2a) for bump in a high aspect ratio pattern of 1.0 or greater is provided thereon.

The electrode pad (3) is a laminated metal film, wherein a Cu plating film (3a) and a Ni plating film (3b) are laminated in layers.

For example, the opening (2a) has a high aspect ratio pattern with a depth of 120 μm, an opening diameter of 70 μm, and an aspect ratio of 1.7. As a bump pitch, a fine pitch with one hundred several tens μm may also be used.

Next, as shown in FIG. 1(b), the alloy layer (4b) which is an Sn—Ag layer is formed on the Sn layer (4a) by electrolytic plating. The alloy layer (4b) which is an Sn—Ag layer is formed so as to have the same height as that of the Sn layer (4a) and to fill the other half of the opening (2a). Specifically, the alloy layer (4b) (Sn—Ag layer) is formed so as to fill the opening (2a) of which the bottom is raised by the Sn layer (4a) and thus the substantial aspect ratio becomes small.

Note that the composition of the other metal contained in the alloy layer (4b) for lamination is set higher than the case of only an alloy plating of Sn and the other metal depending on the target composition in an Sn alloy bump obtained by melting the Sn layer (4a) and the alloy layer (4b), so that compositional control in the Sn alloy bump can be performed.

Specifically, in the first embodiment, the alloy layer (4b) which is an Sn—Ag layer corresponds to the composition of Ag in the Sn alloy bump which is melted with the Sn layer (4a) after reflow processing, so that the composition of Ag in the alloy layer (4b) is set higher than the case of forming an Sn alloy bump only by Sn—Ag plating. For example, when the target composition of Ag in the Sn alloy bump is 2.5 wt %, the composition of Ag in the Sn—Ag layer (the alloy layer (4b)) having the same height as that of the Sn layer (4a) is set to 5 wt %.

Next, the resist (2) is removed and then an Sn—Ag bump is formed as a generally spherical Sn alloy bump (5) by melting the Sn layer (4a) and the alloy layer (4b) (Sn—Ag layer) by reflow processing as shown in FIG. 1(c). For example, a hot air type reflow furnace is used for reflow processing and the Sn—Ag bump is heated in a nitrogen atmosphere in a state where a flux is coated on the bump surface for the purpose of removing an oxide film.

As described above, in the method for manufacturing an Sn alloy bump according to the first embodiment, since the Sn layer (4a) is formed on the electrode pad (3) by electrolytic plating and the alloy layer (4b) composed of Sn and the other metal is laminated on the Sn layer (4a) by electrolytic plating, the depth of the opening (2a) is reduced by the preformed Sn layer (4a) when the preformed Sn layer (4a) is further plated with the alloy layer (4b) so that compositional variations of the other metal can be suppressed in the height direction. Thus, compositional control in the Sn alloy bump (5) after reflow processing can be readily made.

In particular, in the first embodiment, since the alloy layer (4b) serving as an Sn—Ag layer is formed on the Sn layer (4a) by electrolytic plating and then the Sn layer (4a) and the alloy layer (4b) (Sn—Ag layer) are melted, an Sn—Ag alloy bump in which compositional variations of Ag due to the precipitation of Ag are reduced in the height direction so as to control the composition of Ag can be formed.

Figure 2:
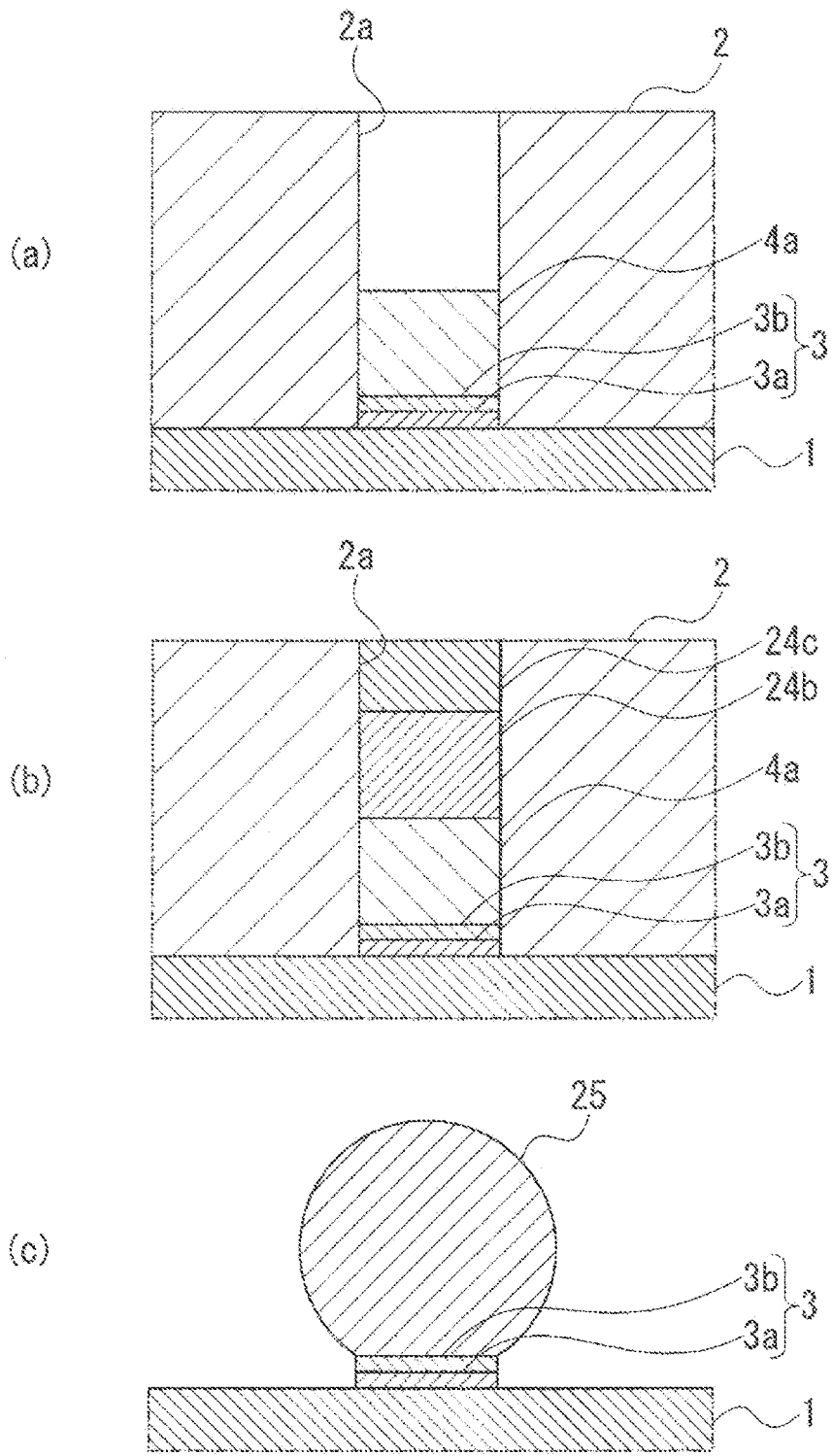
FIG. 2 is a schematic cross-sectional view illustrating the essential part of manufacturing steps in sequence in a method for manufacturing an Sn alloy bump according to a second embodiment of the present invention.

Next, a description will be given of a method for manufacturing an Sn alloy bump according to a second embodiment of the present invention with reference to FIG. 2. In the description of the following embodiment, the same components described in the above embodiment are designated by the same reference numerals and a duplicated explanation will be omitted.

The second embodiment is different from the first embodiment as follows. In the first embodiment, the alloy layer (4b) composed of Sn and one type of metal (Ag) is formed on the Sn layer (4a) to thereby form an Sn alloy bump by reflow processing. In the second embodiment, the other metal is composed of two types of metals. The method for manufacturing an Sn alloy bump according to the second embodiment is a method for manufacturing an Sn alloy bump formed by an alloy composed of Sn and two types of metals. As shown in FIG. 2, two layers of a first alloy layer (24b) composed of Sn and one of the two types of metals and a second alloy layer (24c) composed of Sn and the other of the two types of metals are laminated on the Sn layer (4a) by electrolytic plating and then the resulting layer is melted by reflow processing.

For example, in the second embodiment, a description will be given of a case where one of the two types of metals is Ag and the other of the two types of metals is Cu. As shown in FIG. 2(a), the Sn layer (4a) is firstly formed on the electrode pad (3) in the opening (2a) of the resist (2) formed on the substrate (1) by electrolytic plating.

Next, as shown in FIG. 1(b), two layers of the first alloy layer (24b) which is the Sn—Cu layer and the second alloy layer (24c) which is the Sn—Ag layer are laminated and formed on the Sn layer (4a) by electrolytic plating.

These two layers of the first alloy layer (24b) which is the Sn—Cu layer and the second alloy layer (24c) which is the Sn—Ag layer are formed so as to fill the other half of the opening (2a).

For example, the thickness of each layer is formed in a ratio where the Sn layer (4a): the first alloy layer (24b) (Sn—Cu layer): the second alloy layer (24c) (Sn—Ag layer)=1:1:3.

Note that the composition of the two types of metals contained in the first alloy layer (24b) and the second alloy layer (24c) is set higher than the case of only an alloy plating of Sn and the two types of metals depending on the target composition in the Sn alloy bump (25) obtained by melting the Sn layer (4a), the first alloy layer (24b), and the second alloy layer (24c), so that compositional control in the Sn alloy bump can be performed.

Specifically, in the second embodiment, the first alloy layer (24b) (Sn—Cu layer) and the second alloy layer (24c) (Sn—Ag layer) correspond to the composition of Ag and Cu in the Sn alloy bump which is melted after reflow processing, so that the composition of Ag and Cu in the first alloy layer (24b) (Sn—Cu layer) and the second alloy layer (24c) (Sn—Ag layer), respectively, is set higher than the case of forming an Sn alloy bump only by Sn—Ag—Cu plating. For example, when the target composition in the Sn alloy bump (25) is Sn-3Ag-0.5Cu (% by mass), the Cu composition in the first alloy layer (24b) (Sn—Cu layer) is set to 2.5 wt % and the composition of Ag in the second alloy layer (24c) (Sn—Ag layer) is set to 5 wt %.

Next, the resist (2) is removed and then an Sn—Ag—Cu bump is formed as a generally spherical Sn alloy bump (25) by melting the Sn layer (4a), the first alloy layer (24b), and the second alloy layer (24c) by reflow processing as shown in FIG. 2(c).

Although the first alloy layer (24b) (Sn—Cu layer) and the second alloy layer (24c) (Sn—Ag layer) are sequentially laminated on the Sn layer (4a), the second alloy layer (24c) (Sn—Ag layer) and the first alloy layer (24b) (Sn—Cu layer) may be sequentially laminated on the Sn layer (4a).

As described above, in the method for manufacturing an Sn alloy bump according to the second embodiment, since two layers of the first alloy layer (24b) composed of Sn and one of the two types of metals and the second alloy layer (24c) composed of Sn and the other of the two types of metals are laminated on the Sn layer (4a) by electrolytic plating, the depth of the opening (2a) is reduced by the preformed Sn layer (4a) when the preformed Sn layer (4a) is further plated with the first alloy layer (24b) and the depth of the opening (2a) is further reduced by the first alloy layer (24b) when the first alloy layer (24b) is further plated with the second alloy layer (24c), so that compositional variations of the two types of metals can be suppressed in the height direction.

In particular, in the second embodiment, since two layers composed of the first alloy layer (24b) which is an Sn—Ag layer and the second alloy layer (24c) which is an Sn—Cu layer are formed on the Sn layer (4a) by electrolytic plating and then the Sn layer (4a), the first alloy layer (24b), and the second alloy layer (24c) are melted, an Sn—Ag—Cu alloy bump in which compositional variations of Ag and Cu due to the precipitation of Ag and Cu are reduced in the height direction so as to control the composition of Ag and Cu can be formed.

EXAMPLES

Next, a method for manufacturing the Sn alloy bump of the present invention will be described with reference to the evaluation result of the actually produced Sn alloy bumps by way of Examples based on the aforementioned embodiment.

As a substrate, a wafer having a diameter of 12 inches (30.48 cm) was used. A high aspect ratio resist pattern with a thickness of 120 μm having an opening with a diameter of 80 μm was formed on the surface of the wafer with a pitch of 200 μm.

Firstly, as Example 1 corresponding to the first embodiment, electrolytic plating was performed using a new solution such as an Sn plating solution and an Sn—Ag plating solution based on the following condition.

Specifically, two layer plating was performed, where an Sn plating was applied with a thickness of 60 μm and an Sn—Ag plating was applied with a thickness of 60 μm, and thus, an Sn layer and an alloy layer (Sn—Ag layer) were laminated. At this time, electrolytic plating was performed by setting the condition that the composition of Ag in an Sn alloy bump after reflow processing was 2.5 wt %. Specifically, the concentration of Ag in a plating solution was adjusted to twice that of Ag when an Sn alloy bump was formed only by Sn—Ag plating.

Figure 3:
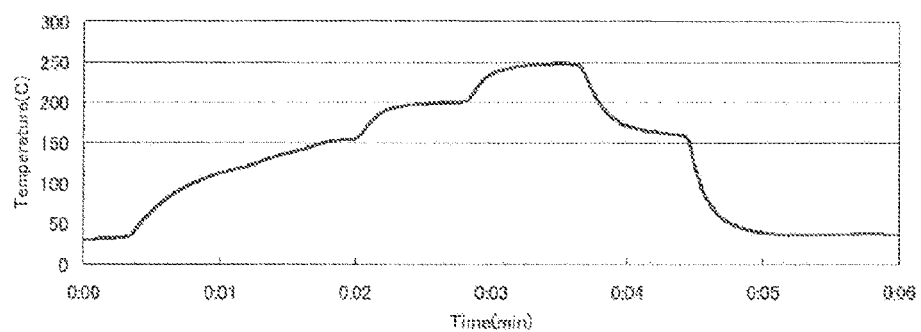
FIG. 3 is a graph illustrating a reflow profile in a method for manufacturing an Sn alloy bump according to Example of the present invention.

Furthermore, reflow processing was performed after removal of the resist to thereby form the Sn alloy bump in Example 1. At this time, reflow processing was performed by a hot air type reflow furnace, and the Sn alloy bump was heated in a nitrogen atmosphere (oxygen concentration of 100 ppm or lower) under the reflow profile condition shown in FIG. 3 in a state where a flux was coated on the bump surface for the purpose of removing an oxide film.

As Comparative Example 1, an Sn—Ag layer single layer with a thickness of 120 μm was formed only by Sn—Ag plating on the opening in a high aspect ratio pattern as in Example 1 to thereby form an Sn alloy bump by reflow processing as in Example 1. At this time, electrolytic plating was performed by setting the condition that the composition of Ag in an Sn alloy bump after reflow processing was 2.5 wt %.

Furthermore, in Example 2 and Comparative Example 2, electrolytic plating was performed in an Sn—Ag plating solution with which about 1,000 wafers were subject to plating processing under the same conditions in Example 1 and Comparative Example 1, respectively, to thereby form Sn alloy bumps by reflow processing as in Example 1 and Comparative Example 1, respectively. Note that the concentration of Ag in the solution in Example 2 and Comparative Example 2 was the same as that used in Example 1 and Comparative Example 1, respectively.

As a result of measuring the composition of Ag in each of these Sn alloy bumps in Examples 1 and 2 and Comparative Examples 1 and 2 by means of XRF (fluorescent x-ray analysis), the average bump compositions in Example 1, Comparative Example 1, Example 2, and Comparative Example 2 were 2.5 wt %, 2.5 wt %, 2.4 wt %, and 2.0 wt %, respectively. As described above, when a new plating solution was used, the target composition of Ag was obtained in both Example 1 and Comparative Example 1. However, when a plating solution with which about 1,000 wafers have been subject to plating processing was used, the composition of Ag was lower than the target composition of Ag in Comparative Example 2 but the target composition of Ag was substantially retained in Example 1.

Next, in Example 3 corresponding to the second embodiment, electrolytic plating was performed by using a new solution including an Sn plating solution, an Sn—Cu plating solution, and an Sn—Ag plating solution based on the following condition.

Specifically, the same wafer as that used in Example 1 was used. Electrolytic plating was performed such that three layer plating was performed, where an Sn plating was applied with a thickness of 24 μm and an Sn—Cu plating was applied with a thickness of 24 μm under the condition that the composition of Cu in a film was 2.5 wt %, and an Sn—Ag plating was applied with a thickness of 72 μm under the condition that the composition of Ag in a film was 5 wt % and the composition of the Sn alloy bump after reflow processing reaches Sn-3Ag-0.5Cu. Furthermore, reflow processing was performed after removal of the resist to thereby form the Sn alloy bump in Example 2.

Furthermore, after electrolysis was applied in a plating solution with which about 1,000 wafers have been subject to plating processing, the above plating processing was performed under the same condition. As a result of measuring the composition of Ag in the Sn alloy bump subjected to reflow processing by means of XRF, the average bump composition was constant without being affected by electrolysis.

The technical scope of the present invention is not limited to the aforementioned embodiments and Examples, but the present invention may be modified in various ways without departing from the scope or teaching of the present invention.

For example, while it is preferable as in the second embodiment that two layers composed of the first alloy layer (24b) (Sn—Cu layer) and the second alloy layer (24c) (Sn—Ag layer) are laminated on an Sn layer and then these laminated layers are melted by reflow processing to thereby form an Sn—Ag—Cu ternary bump, an Sn—Ag—Cu layer which is an alloy layer composed of Sn and two types of metals, i.e., Ag and Cu may be laminated on an Sn layer and then these laminated layers may be melted by reflow processing to thereby form an Sn—Ag—Cu ternary bump.

REFERENCE NUMERALS

1: substrate, 2: resist, 2a: opening, 3: electrode pad (electrode), 4a: Sn layer, 4b: alloy layer, 5, 25: Sn alloy bump, 24b: first alloy layer, 24c: second alloy layer

What is claimed is:

1. A method for manufacturing an Sn alloy bump formed of an alloy composed of Sn and other one or more types of metals, the method comprising:
 a step of forming an Sn layer on an electrode in a resist opening formed on a substrate by electrolytic plating;
 a step of laminating an alloy layer composed of Sn and the other metal on the Sn layer by electrolytic plating; and
 a step of forming an Sn alloy bump by melting the Sn layer and the alloy layer after removal of the resist.

2. The method for manufacturing an Sn alloy bump according to claim 1, wherein the other metal is Ag and the method comprises:
 a step of forming an Sn—Ag layer as the alloy layer on the Sn layer by electrolytic plating; and
 a step of forming an Sn—Ag bump as the Sn alloy bump by melting the Sn layer and the Sn—Ag layer after removal of the resist.

3. The method for manufacturing an Sn alloy bump according to claim 1, wherein the other metal is composed of two types of metals and the method comprises:
 a step of laminating two layers of an alloy layer composed of Sn and one of the two types of metals and an alloy layer composed of Sn and the other of the two types of metals on the Sn layer by electrolytic plating; and
 a step of forming an Sn alloy bump by melting the Sn layer and the two alloy layers laminated thereon after removal of the resist.

4. The method for manufacturing an Sn alloy bump according to claim 3, wherein one of the two types of metals is Ag and the other of the two types of metals is Cu and the method comprises:
 a step of forming two layers composed of an Sn—Ag layer and an Sn—Cu layer on the Sn layer by electrolytic plating; and
 a step of forming an Sn—Ag—Cu bump as the Sn alloy bump by melting the Sn layer, the Sn—Ag layer, and the Sn—Cu layer after removal of the resist.

* * * * *